US008623451B2

(12) United States Patent
Wang et al.

(10) Patent No.: US 8,623,451 B2
(45) Date of Patent: Jan. 7, 2014

(54) LARGE-SCALE LATERAL NANOWIRE ARRAYS NANOGENERATORS

(75) Inventors: Zhong L. Wang, Marietta, GA (US); Chen Xu, Atlanta, GA (US); Yong Qin, Atlanta, GA (US); Guang Zhu, Atlanta, GA (US); Rusen Yang, Minneapolis, MN (US); Youfan Hu, Atlanta, GA (US); Yan Zhang, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 389 days.

(21) Appl. No.: 12/943,499

(22) Filed: Nov. 10, 2010

(65) Prior Publication Data

US 2011/0107569 A1 May 12, 2011

Related U.S. Application Data

(60) Provisional application No. 61/259,806, filed on Nov. 10, 2009, provisional application No. 61/348,909, filed on May 27, 2010, provisional application No. 61/362,066, filed on Jul. 7, 2010.

(51) Int. Cl.
*B05D 5/12* (2006.01)
*H01L 41/22* (2013.01)
*H01L 41/00* (2013.01)
*H04R 17/00* (2006.01)
*H02N 2/00* (2006.01)

(52) U.S. Cl.
USPC ............................ 427/100; 29/25.35; 310/311

(58) Field of Classification Search
USPC ........................................................ 427/100
See application file for complete search history.

(56) References Cited

U.S. PATENT DOCUMENTS

| 5,503,961 | A | * | 4/1996 | Linde et al. ................... 430/315 |
|---|---|---|---|---|
| 6,586,095 | B2 | | 7/2003 | Wang et al. |
| 7,220,310 | B2 | | 5/2007 | Wang et al. |
| 7,351,607 | B2 | | 4/2008 | Wang et al. |
| 7,705,523 | B2 | | 4/2010 | Wang et al. |
| 7,898,156 | B2 | | 3/2011 | Wang et al. |
| 2003/0205657 | A1 | | 11/2003 | Voisin |

(Continued)

OTHER PUBLICATIONS

Pu Xian Gao, Jinhui Song, Jin Liu, and Zhong Lin Wang. Nanowire Piezoelectric Nanogenerators on Plastic Substrates as Flexible Power Sources for Nanodevices. 2007. Adv. Mater. 19, 67-72.*

(Continued)

*Primary Examiner* — Dah-Wei Yuan
*Assistant Examiner* — Kristen A Dagenais
(74) *Attorney, Agent, or Firm* — Bryan W. Bockhop; Bockhop & Associates, LLC

(57) ABSTRACT

In a method of making a generating device, a plurality of spaced apart elongated seed members are deposited onto a surface of a flexible non-conductive substrate. An elongated conductive layer is applied to a top surface and a first side of each seed member, thereby leaving an exposed second side opposite the first side. A plurality of elongated piezoelectric nanostructures is grown laterally from the second side of each seed layer. A second conductive material is deposited onto the substrate adjacent each elongated first conductive layer so as to be coupled the distal end of each of the plurality of elongated piezoelectric nanostructures. The second conductive material is selected so as to form a Schottky barrier between the second conductive material and the distal end of each of the plurality of elongated piezoelectric nanostructures and so as to form an electrical contact with the first conductive layer.

7 Claims, 4 Drawing Sheets

(56) References Cited

U.S. PATENT DOCUMENTS

| | | |
|---|---|---|
| 2004/0127025 A1 | 7/2004 | Crocker, Jr. et al. |
| 2005/0188751 A1 | 9/2005 | Puskas |
| 2005/0242366 A1 | 11/2005 | Parikh et al. |
| 2008/0067618 A1 | 3/2008 | Wang et al. |
| 2009/0066195 A1* | 3/2009 | Wang et al. ............ 310/367 |
| 2009/0115293 A1 | 5/2009 | Wang et al. |
| 2009/0179523 A1 | 7/2009 | Wang et al. |
| 2009/0209303 A1 | 8/2009 | Kroll et al. |
| 2010/0026142 A1 | 2/2010 | Jones et al. |
| 2010/0117488 A1 | 5/2010 | Wang et al. |
| 2010/0147371 A1 | 6/2010 | Cho |
| 2010/0191153 A1 | 7/2010 | Sanders et al. |

OTHER PUBLICATIONS

Yong Qin, Rusen Yang, and Zhong Lin Wang. Growth of Horizontal ZnO Nanowire Arrays on Any Substrate. Nov. 29, 2008. J. Phys. Chem., 112 (48), 18734-18736.*

L. W. Ji, S. M. Peng, Y. K. Su, S. J. Young, C. Z. Wu et al. Ultraviolet Photodetectors Based on Selectively Grown ZnO Nanorod Arrays. May 20, 2009. Appl. Phys. Lett. 94.*

Ali Javey, SungWoo Nam, Robin S. Friedman, Hao Yan, and Charles M. Lieber. Layer-by-Layer Assembly of Nanowires for Three-Dimensional, Multifunctional Electronics. 2007. Nano Letters.vol. 7, No. 3. 773-777.*

Bejamin Wientraub, Yulin Deng, and Zhong L. Wang. Position-Controlled seedless Growth of ZnO Nanorod Arrays on a Polymer Substrate via Wet Chemical Synthesis. Jun. 8, 2007. Phys. Chem. Letters. 111. 10162-10165.*

Sheng Xu, Yaguang Wei, Jin Liu, Rusen Yang, and Zhong Lin Wang. Integrated Multilayer Nanogenerator Fabricated Using Paired Nanotip-to-Nanowire Brushes. Oct. 22, 2008. Nano Letters. vol. 8. No. 11, 4027-4032.*

Jeon et al., "MEMS power generator with transverse mode thin film PCT," Science Direct, vol. 122, Issue 1, Jul. 29, 2005, pp. 16-22.

Gao et al., Nanoarchitectures of semiconducting and piezoelectric zinc oxide, J. Applied Physics 97, 044304 (2005).

Wang et al., "Large-Size Liftable Inverted-Nanobowl Sheets as Reusable Masks for Nanolithography," Nano Letters, vol. 5, No. 9, 2005, 1748-1788.

Lao et al., "Formation of double-side teethed nanocombs of ZnO and self-catalysis of Zn-terminated polar surface," Chemical Physics Letters, Elsevier B.V., 2005.

Jeon et al., "MEMS power generator with transverse mode thin film PZT," Sensors and Actuators A Physical, Elsevier, (2005).

Lao et al., "Formation of double-side teethed nanocombs of ZnO and self-calalysis of Zn-terminated polar surface," Chemical Physics Letters (Science Direct), (Abstract), 2007.

Wang et al., "Large-Size Liftable Inverted-Nanobowl Sheets as REusable Masks for Nanolithography," Nano Letters, vol. 5, (Abstract), 2005.

Wang et al., "Piezoelectric Nanogenerators Based on Zinc Oxide Nanowire Arrays," Science, vol. 312, pp. 242-245, Apr. 14, 2006.

Peck-Radosavjevic et al., "Thrombopoietin induces rapid resolution of thrombocytopenia after orthotopic liver transplantation through increased platelet production," Blood, vol. 95, No. 3, (2000).

* cited by examiner

LARGE-SCALE LATERAL NANOWIRE ARRAYS NANOGENERATORS

CROSS-REFERENCE TO RELATED APPLICATION(S)

This application claims the benefit of U.S. Provisional Patent Application Ser. No. 61/259,806, filed Nov. 10, 2009, the entirety of which is hereby incorporated herein by reference. This application also claims the benefit of U.S. Provisional Patent Application Ser. No. 61/348,909, filed May 27, 2010, the entirety of which is hereby incorporated herein by reference. This application also claims the benefit of U.S. Provisional Patent Application Ser. No. 61/362,066, filed Jul. 7, 2010, the entirety of which is hereby incorporated herein by reference.

STATEMENT OF GOVERNMENT INTEREST

This invention was made with government support under contract No. DE-FG02-07ER46394, awarded by the Department of Energy and under contract No. DMI-0403671 awarded by the National Science Foundation. The government has certain rights in the invention.

BACKGROUND OF THE INVENTION

1. Field of the Invention

The present invention relates to electrical generators and, more specifically, to electrical generators employing piezoelectric nanostructures.

2. Description of the Related Art

As an abundant energy in our daily life, mechanical energy ranges from sonic waves, mechanical vibration and impacts, air flow (e.g., wind), friction, hydraulic and ocean waves, which are available around the clock. Harvesting mechanical energy and converting it into electrical energy is becoming an increasingly important alternative to conventional electrical generation methods.

Piezoelectric zinc oxide (ZnO) nanowires (nanowires) have been used for harvesting small-scale mechanical energy created by a gentle physical motion. Using a single ZnO nanowire, an alternating-current (AC) generator has been demonstrated based on cyclic stretching and releasing of a piezoelectric fine-wire.

The design of a single nanowire based AC-NG uses a piezoelectric wire that is firmly contacted at its two ends with metal electrodes, laterally bonded and packaged on a flexible substrate, the bending of which can be driven by mechanical agitation present in our living environment. The single wire generator demonstrates a robust approach for harvesting low-frequency energy generated by in-vitro human or animal motion. However, the output power of a single nanowire based nanogenerator (NG) may be limited. In certain practical applications, it is essential to scale up the design of the AC-NGs so as to integrate the contributions made by millions of nanowires in order to enhance the output power.

Most current systems are not sufficiently scalable to enable them to generate power for many applications.

Therefore, there is a need for large scale nanogenerator arrays.

SUMMARY OF THE INVENTION

The disadvantages of the prior art are overcome by the present invention which, in one aspect, is a method of making a generating device in which a plurality of spaced apart elongated seed members are deposited onto a first surface of a flexible non-conductive substrate. An elongated first conductive layer is applied to a top surface and a first side of each seed member, thereby leaving an exposed second side opposite the first side. A plurality of elongated piezoelectric nanostructures, each having a distal end, are grown laterally from the second side of each seed layer. A second conductive material is deposited onto the substrate adjacent each elongated first conductive layer so as to be coupled the distal end of each of the plurality of elongated piezoelectric nanostructures. The second conductive material is selected so as to form a Schottky barrier between the second conductive material and the distal end of each of the plurality of elongated piezoelectric nanostructures and so as to form an electrical contact with the first conductive layer.

In another aspect, the invention is a method of making a nanogenerator in which a plurality of vertical piezoelectric nanowires is grown from a first substrate. A second substrate is drawn across the plurality of vertical piezoelectric nanowires with sufficient force so that a set of nanowires of the plurality of vertical piezoelectric nanowires is transferred onto the second substrate along a preselected direction. A plurality of spaced apart conductive stripes is deposited onto the substrate and portions of the set of nanowires so that the conductive stripes are oriented transversely to the preselected direction.

In yet another aspect, the invention is a method of making a generator, in which a first electrode layer is deposited onto a substrate. At least a first insulator layer is deposited onto the first electrode layer. At least a first plurality of elongated frustoconically-shaped piezoelectric nanostructures is placed onto the first insulator layer so that the piezoelectric nanostructures are oriented so as to have different lateral axes and so as to have a substantially common vertical axis. At least a second insulator layer is deposited onto the first plurality of elongated frustoconically-shaped piezoelectric nanostructures. A second electrode layer is deposited above the second insulator layer.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1A:
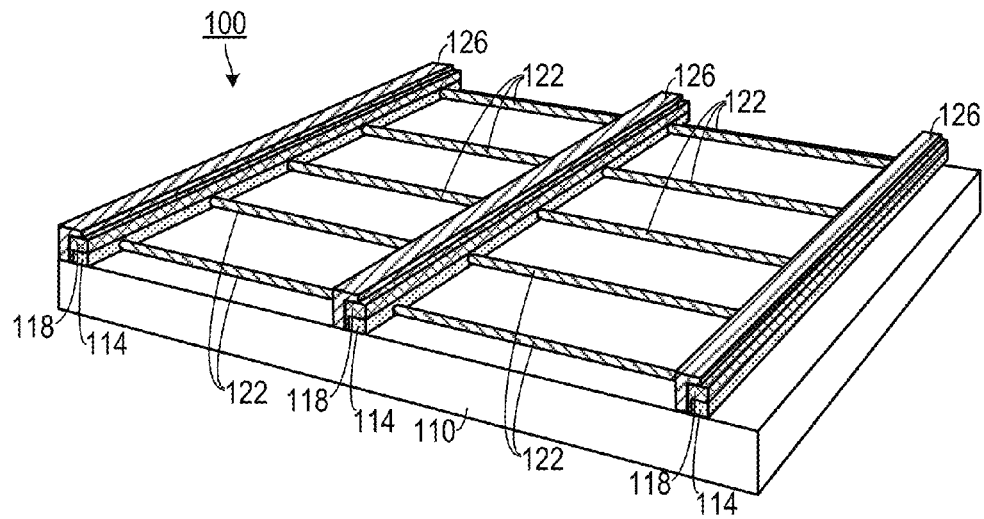
FIG. 1A is a top perspective view of one embodiment of a nanogenerator.

A preferred embodiment of the invention is now described in detail. Referring to the drawings, like numbers indicate like parts throughout the views. Unless otherwise specifically indicated in the disclosure that follows, the drawings are not necessarily drawn to scale. As used in the description herein and throughout the claims, the following terms take the meanings explicitly associated herein, unless the context clearly dictates otherwise: the meaning of "a," "an," and "the" includes plural reference, the meaning of "in" includes "in" and "on."

The embodiments disclosed herein combine a rational chemical growth of nanowires (nanowires) with nanofabrication for building multiple lateral-nanowire-arrays integrated into nano-generators (NGs) for large-scale and high output energy harvesting. The fabrication uses a flexible and stretchable polymer as substrate and the processing temperatures at the substrate is lower than 100° C. In one embodiment, a voltage output of 1.26 V has been demonstrated, which will allow these embodiments to be employed in self-powered nanosystems.

The following U.S. Patent Applications disclose methods of generating zinc oxide piezoelectric nanostructures of the types disclosed below and are hereby incorporated by reference: Ser. No. 10/726,016, filed on Dec. 2, 2003 by Wang et al., Ser. No. 11/608,865, filed on Dec. 11, 2006 by Wang et al., Ser. No. 11/760,002, filed on Jun. 8, 2007 by Wang et al., Ser. No. 12/209,310, filed on Sep. 12, 2008 by Wang et al., and Ser. No. 12/413,470, filed on Mar. 27, 2009 by Wang et al. U.S. Pat. No. 6,586,095 issued on Jul. 1, 2003 to Wang et al. also discloses methods of generating piezoelectric nanostructures and is hereby incorporated by reference.

Figure 1B:
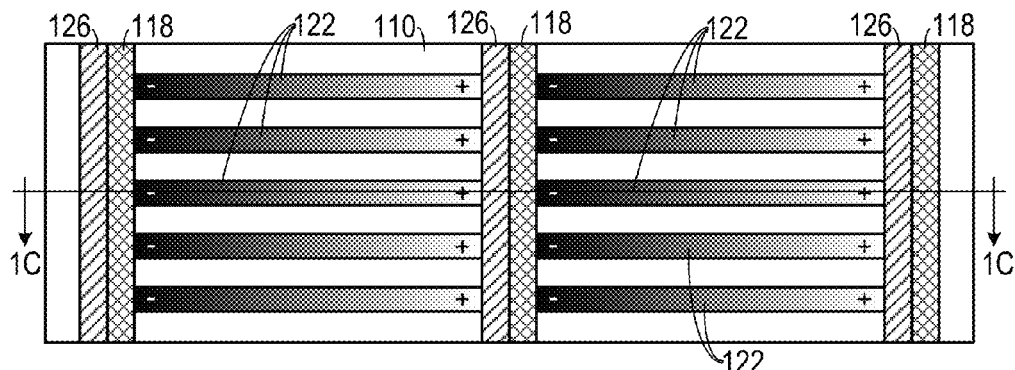
FIG. 1B is a top plan view of the embodiment shown in FIG. 1A.
Figure 1C:
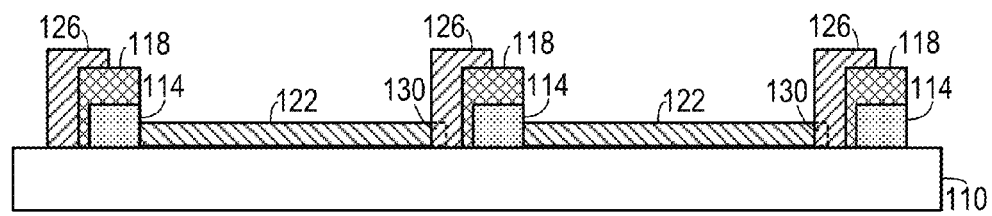
FIG. 1C is a cross sectional view of the embodiment shown in FIG. 1B, taken along line 1C-1C.
Figure 2A:
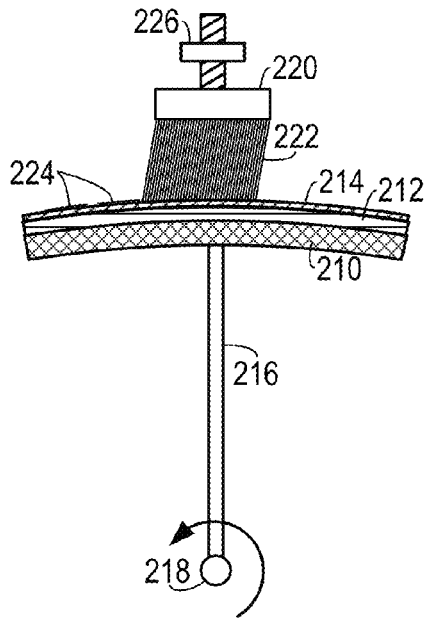
FIGS. 2A-2E are a series of schematic diagrams showing one method of making a nanogenerator.
Figure 2B:
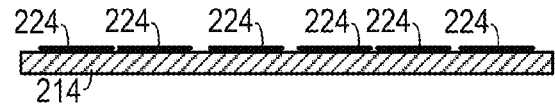
Figure 2C:
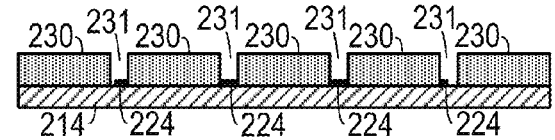
Figure 2D:
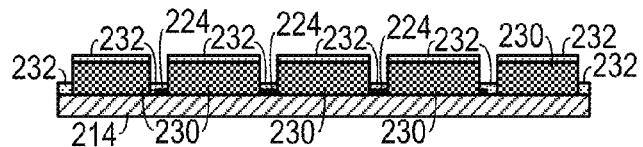
Figure 2E:
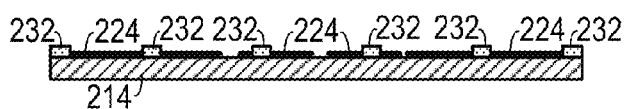
Figure 3:
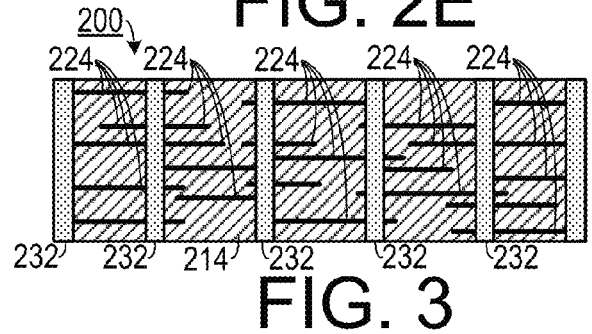
FIG. 3 is a top plan view of a nanogenerator made according to the method shown in FIGS. 2A-2E.

As shown in FIGS. 1A-1C, one embodiment of a generating device 100 includes a flexible non-conductive substrate 110 (which in one embodiment is a polymer film, such as poly(4,4'-oxydiphenylene-pyromellitimide) commercially referred to as Kapton®) onto which elongated seed members 114 (such as stripes of zinc oxide) have been deposited. The top and one side of the seed members 114 are coated with a first conductive material 118 (such as chromium), leaving one side of each seed member 114 exposed. A plurality of elongated piezoelectric nanostructures 122 (such as zinc oxide nanowires) is grown from the exposed side of the seed members 114. A second conductive material 126 (such as gold) is deposited onto the substrate 110, a portion of the first conductive material 118 and the distal ends of the piezoelectric nanostructures 122. The second conductive material 126 forms a Schottky barrier between the second conductive material 126 and the distal ends 130 of the plurality of elongated piezoelectric nanostructures 122. An electrical contact is formed between the first conductive layer 118 and the second conductive material 126.

The generating device 100 employs the piezoelectric effect with the presence of a Schottky contact at least at one end electrode. Since the diameter of the nanowire is much smaller than the thickness of the substrate film, the nanowire 122 is subjected essentially to a pure tensile strain when the substrate 110 is stretched, and a piezoelectric potential drop is created along the nanowire 122, with the positive c-axis of the crystal orientation pointing toward a higher piezopotential side. A Schottky barrier formed at least at one end-contact of the nanowire 122 serves as a "gate" that prevents the flow of electrons across the nanowire-metal interface so that the electrons are accumulated adjacent to the contact. This is the charging process. When the substrate 110 is released from straining, the strain in the nanowire 122 is released and the corresponding piezopotential disappears as well. The accumulated electrons will back flow through the external load. This is the charge releasing process. The piezopotential in the nanowire 122 serves as a "charging pump" that drives the back and forth flows of the electrons in the external circuit in responding to the straining and releasing of the nanowire 122. If the charging and discharging processes of many nanowires are synchronized, the generated AC voltages can be added up constructively, resulting in a high output.

Several factors have to be considered to constructively integrate the outputs of many single-wire based nanogenerators. First, the metal contacts at the two ends of the nanowire 122 arrays should be non-symmetric to produce a Schottky contact at one side and an Ohmic contact at the other side. Second, the contacts at the two ends of the nanowires should be robust, which is achieved by fully enclosing the distal ends 130 of the nanowires 122 with the deposited metal 126 so that the mechanical deformation can be more effectively transmitted from the electrodes to the nanowires. Third, the ZnO nanowires 122 should all have the same crystallographic orientation to ensure the polarities of the piezoelectric potentials generated in all of the nanowires 122 are aligned.

Since a ZnO nanowire grows in parallel to the c-axis for a general case, and with consideration its anisotropic wurtzite structure and its polarization along the c-axis, the nanowires need to be rationally grown directly on the substrate rather than by chemical assembly, the latter usually gives orientation alignment but not crystallographic polarity alignment. The polarity aligned nanowires 122 create a macroscopic piezoelectric potential; in contrast, randomly c-axis oriented nanowires may result in cancellation of the generated electric currents. Finally, all of the ZnO nanowires 122 should be stretched and released in a synchronized manner, so that the polarities of the piezoelectric potential generated by all of the nanowires 122 are in the same direction at the same time, resulting in the maximized output voltage.

One experimental embodiment was used to fabricate a laterally-integrated nanogenerator to meet all of the conditions discussed above. The first step was to grow crystallographically aligned nanowire arrays using chemical approach at <100° C. An array of stripes of ZnO seed layers 114 were first deposited on a polymer substrate 110. After covering one side and the top side of the seed stripes with Cr that prevented the local growth, ZnO nanowires 122 were grown directly from the exposed seed layer 114 at the other side using chemical approach along the direction almost parallel to the substrate. The lengths of the nanowires were controlled by growth time. Then, a gold (Au) layer 126 was deposited using an aligned mask technique to connect the distal tips 130 of the ZnO nanowires with the Au electrode 126. The work function of Au is higher than the electron affinity energy of ZnO, which usually leads to a Schottky connection between ZnO nanowires and Au electrodes. An Ohmic contact is formed between ZnO and Cr at the other end. By depositing a thick Au film, the distal tip ends 130 of the nanowires 122 were fully enclosed and bonded with the Au electrode 126 so that the nanowires 122 could be robust for mechanical deformation without loose contacts. Mechanical stretching of the substrate 110 produced tensile strain in the nanowires 122, which created a macroscopic piezoelectric potential along the nanowires 122 owing to the crystallographic alignment of the nanowires 122. The multi rows of nanogenerators were integrated to form a flexible sheet.

In the experimental embodiment, patterned ZnO stripes covered with Cr layer on the top were fabricated as the seed layer. A Kapton film with a thickness of 125 μm (available from Dupont) was cleaned with acetone, isopropyl alcohol and ethanol using ultrasonic, which was used as the substrate. A photoresist (Shipley Microposit 1813) was spin coated onto this film at a speed of 3000 RPM for 40 seconds. Then the film was baked at 110° C. for 10 minutes. The film was first patterned using mask aligner. Then, 300 nm ZnO and 5 nm Cr layers were deposited. Finally, after developing and lifting off, the stripe-shape ZnO pattern with a top layer of Cr was fabricated. The second step was to deposit Cr only at one side of the ZnO stripe but with the other side exposed. The entire structure was spin coated by a layer of photoresist, then a mask was used to cover only one side of the ZnO strip by controlling its offset position. Optical lithography followed by developing exposed only one side of the strips. Then, a layer of Cr (10 nm) was sputtered onto the system. A lift-off produced the structure. In the third step, the growth of ZnO nanowire arrays was carried out using solution chemistry at 80° C. After 12 hours aging in the solution, the film surface turned white, indicating that it was covered by ZnO nanowire arrays. Then it was rinsed with deionized water for several times and baked at 100° C. for 1 hour to dry.

Figure 8:
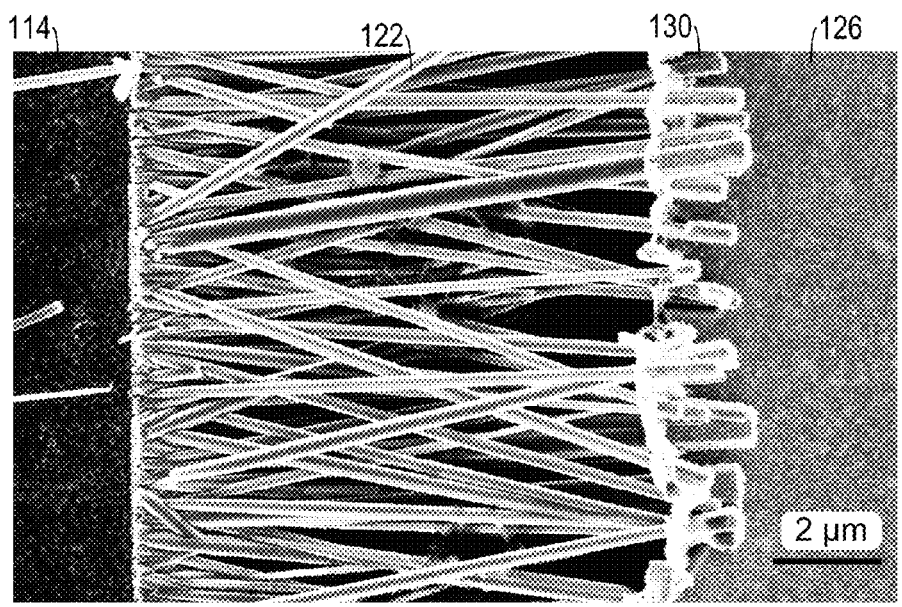
FIG. 8 is a micrograph of a nanogenerator according to the embodiment shown in FIG. 1A.

FIG. 8 shows a typical scanning electron microscopy (SEM) image of a horizontally grown ZnO nanowire 122 arrays, grown from the seed layer 114 and the gold electrode 126. Most of the ZnO nanowires 122 were grown horizontally with one end fixed onto the seed layer 114. The length of the nanowires 122 was about 5-6 microns and the diameter was about several hundred nanometers. The length of the nanowires was controlled by refreshing the aging solution and increasing the aging time so that they reached the other electrode In the fourth step, patterned Au electrodes were fabricated using a masking technique, and the Au was deposited only at the side where the Cr layer was present. The thickness of the Au layer 126 was controlled to ensure a good connection between the nanowires and the electrodes.

The entire structure was packaged using insulative soft polymer, such as a photoresist (MicroChem PMMA 950K A2). This packaging layer fixed the ZnO nanowires firmly onto the substrate and made the nanowires to be synchronized in mechanical stretching or releasing with the outer surface of the Kapton film.

To measure the energy harvesting performance of the experimental embodiment of the nanogenerator, a periodic external force was used to deform the substrate so that the nanowires experienced a cycling stretching-releasing deformation process. Since the thickness of the Kapton substrate was much thicker than the diameter of the nanowires, a push to the substrate at its middle section by a mechanical motor resulted in a stretch at its outer surface, which produced a pure tensile strain across the rows of the nanogenerator built on the top. Such strain was calculated based on the curvature of the bending and the thickness of the substrate film.

Increasing the strain is an effective way to obtain high output voltage and current, because the magnitude of the piezopotential increases approximately linearly with strain. In the experimental embodiment, both the output current and voltage increased with the increase of straining rate.

Based on a rational chemical synthesis of nanowire arrays parallel to a polymer substrate, a row-by-row laterally integrated nanogenerators has been fabricated for raising the output voltage of the nanogenerators. A generator structure made of 700 rows of nanowire arrays raised the magnitude of the output voltage to 1.26 V in responding to low frequency mechanical straining at straining rate of 2.13% per second to a strain of 0.19%. The structure was built on a general flexible, foldable and stretchable substrate. All of the processing and fabrication were done at substrate temperature of less than 100° C., thus, they can be applied to many materials at low-cost. The materials used are environmentally friendly and biocompatible. ZnO nanowires are easy to grow on any substrate and any shape substrate at low temperature. Experimental observation shows that ZnO nanowires are robust and fatigue free. Therefore, a layer-by-layer integration of generators is possible for fabricating three-dimensional energy harvesters that have a high enough output for powering small electronic devices for independent, sustainable and self-powered operations.

In another embodiment, as shown in FIGS. 2A-2E and FIG. 3, a nanogenerator 200 can be made by growing a plurality of vertical piezoelectric nanowires 222 (such as zinc oxide nanowires) from a first substrate 220. A second substrate 214 (such as a polymer film) is drawn across the plurality of vertical piezoelectric nanowires 222 with sufficient force so that a set of nanowires 224 of the plurality of vertical piezoelectric nanowires 222 is transferred onto the second substrate 214 along a common direction. The drawing of the second substrate 214 may be accomplished through use of an arm 216 secured to a pivot 218, at the end of which is a curved platform 210 and a cushion member 212 onto which the second substrate 214 is placed. The first substrate 220 is secured to a pressure adjusting device 226 that is configured to ensure that the correct amount of force is applied to allow transfer of the nanowires 224.

A plurality of spaced apart conductive stripes 232 are deposited onto the second substrate 214 and portions of the set of nanowires 224 so that the conductive stripes 232 are oriented transversely to the direction of the set of nanowires 224. This is done by applying a plurality of photoresist bands 230 onto the second substrate so as to define a plurality of passages 231 therebetween. Each passage 231 is complimentary in shape to one of the conductive stripes 232. A conductive metal (such as gold) is deposited onto the substrate and the photoresist bands 230. The photoresist bands 230 are removed, thereby leaving the conductive stripes 232 formed from the conductive metal.

Figure 4:
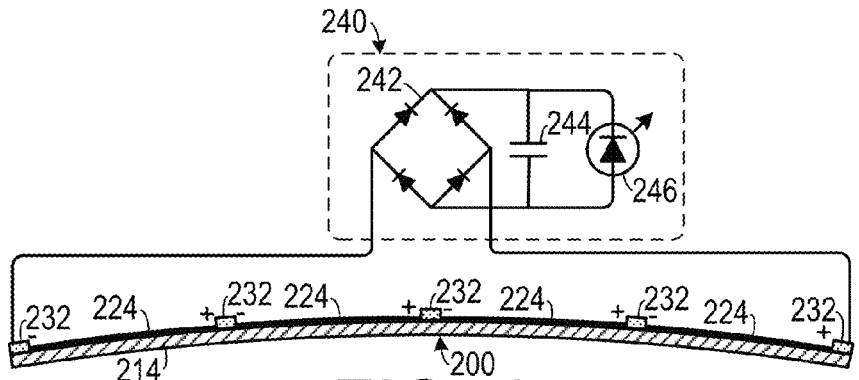
FIG. 4 is a schematic diagram of a nanogenerator according to the embodiment shown in FIG. 3, configured to drive a load.
Figure 5A:
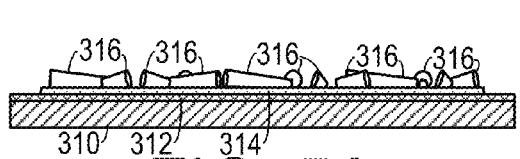
FIGS. 5A-5E are a series of schematic diagrams showing a method of making a nanogenerator employing frusto-conically shaped nanostructures.
Figure 5B:
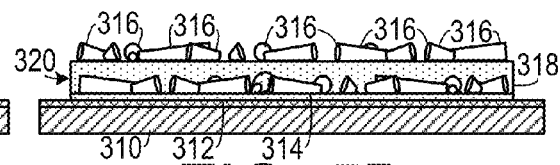
Figure 5C:
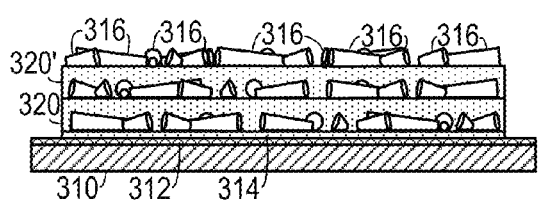
Figure 5D:
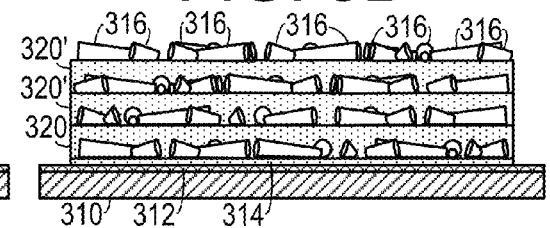
Figure 5E:
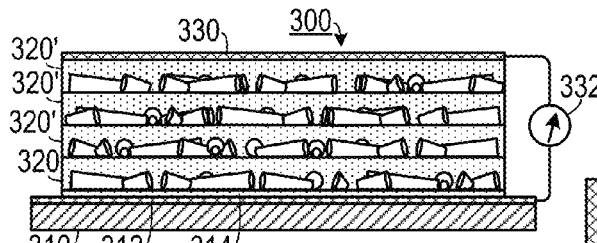
Figure 6:
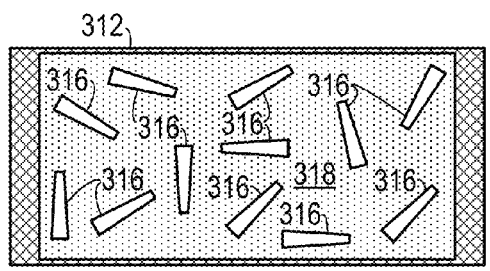
FIG. 6 is a top plan view of a plurality of frusto-conically shaped nanostructures dispose on an insulating layer employed in a nanogenerator.

As shown in FIG. 4, the nanogenerator 200 can be coupled to a load 240, such as a rectification circuit 242 and a storage capacitor 244, which may be used to drive, for example, a light emitting diode 246. The working principle is demonstrated in FIG. 4, in which nanowires 224 connected in parallel collectively contribute to the current output and nanowires 224 in different rows connected in series constructively improve the voltage output. It is worth noting that, the same growth direction of all nanowires and the sweeping printing method ensures that the crystallographic orientations of the horizontal nanowires are aligned along the sweeping direction. Consequently, the polarity of the induced piezopotential is also aligned, leading to a macroscopic potential contributed constructively by all of the nanowires 224.

In one experimental embodiment, the power output was scaled up with the integration of hundreds of thousands of horizontally-aligned nanowires, which was made by a scalable sweeping-printing-method that is simple, cost-effective and highly efficient. The method included two main steps. In the first step, the vertically-aligned nanowires were transferred to a receiving substrate to form horizontally-aligned arrays. The major components of the transfer setup were two stages, Stage 1 had a flat surface that faces downwards and held the vertically-aligned nanowires; stage 2 had a curved surface and held the receiving substrate. A polydimethylsiloxane (PDMS) film on the surface of stage 2 was used as a cushion layer to support the receiving substrate and enhance the alignment of the transferred nanowires. The radius of the curved surface of stage 2 equaled the length of the rod supporting the stage, which was free to move in circular motion. In the second step, electrodes were deposited to connect all of the nanowires together.

In the experimental embodiment, vertically-aligned ZnO nanowires on a Si substrate were synthesized using physical vapor deposition. The dense and uniform nanowires had a length of about 50 μm, a diameter of about 200 nm, and growth direction along c-axis. The same growth direction of nanowires ensures the alignment of the piezoelectric potentials in all of the nanowires and a successful scaling up of the output. A small piece of Si substrate with grown ZnO nanowires was mounted onto stage 1 and a piece of Kapton® film with the thickness of 125 μm was attached to stage 2 (FIG. 1a). The distance between the receiving substrate and nanowires was precisely controlled to form a loose contact between the two. The receiving substrate then counterclockwise swept across the vertical nanowires arrays, which were detached from Si substrate and aligned on the receiving substrate along the direction of sweeping due to the applied shear force. The as-transferred nanowires had an estimated average density of $1.1 \times 10^6$ cm$^{-2}$.

Next, the evenly spaced electrode pattern over the aligned nanowires was defined using photolithography and then followed by sputtering 300 nm thick Au film. After the lifting off the photoresist, 600 rows of stripe-shaped Au electrodes with 10 μm spacing were fabricated on top of the horizontal nanowire arrays. Au electrodes form Schottky contacts with the ZnO nanowires. Approximately $3.0 \times 10^5$ nanowires in an effective working area of 1 cm$^2$ were in contact with electrodes at both ends. Finally, a PDMS packaging over the entire structure was used to further enhance mechanical robustness and protect the device from invasive chemicals.

In another embodiment, as shown in FIGS. 5A-5E and FIG. 6, a generator 300 may be made by depositing a first electrode layer 312, that would typically include a metal, onto a substrate 310, which could include polymer film, such as poly(4,4'-oxydiphenylene-pyromellitimide). At least a first insulator layer 314 (which could include poly(methyl methacrylate) is deposited onto the first electrode layer 312. At least a first plurality of elongated frustoconically-shaped piezoelectric nanostructures 316 (such as zinc oxide nanostructures) are placed onto the first insulator layer 314 so that the piezoelectric nanostructures 316 are oriented so as to have different lateral axes and so as to have a substantially common vertical axis. At least a second insulator layer 318 (which could include poly(methyl methacrylate) is deposited onto the first plurality of elongated frustoconically-shaped piezoelectric nanostructures 316 so as to form a first insulated nanostructure layer 320. Subsequent insulated nanostructure layers 320' may be placed on the first insulated nanostructure layer 320. A second electrode layer 330 is deposited on the top of the top-most insulated nanostructure layer 320'. The generator 300 may be employed to power a load 332, such as a liquid crystal display, by flexing the substrate 310 to apply strain to the elongated frustoconically-shaped piezoelectric nanostructures 316. When strain is applied, the elongated frustoconically-shaped piezoelectric nanostructures 316 generate a varying electric field that induces charge movement in the electrode layers 314 and 330.

Figure 7A:
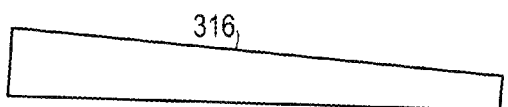
FIGS. 7A-7C are schematic diagrams demonstrating the development of a vertical electrical field using frusto-conically shaped nanostructures.
Figure 7B:
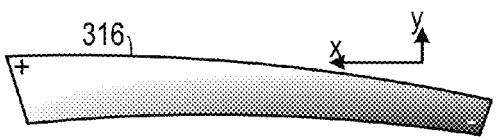
Figure 7C:
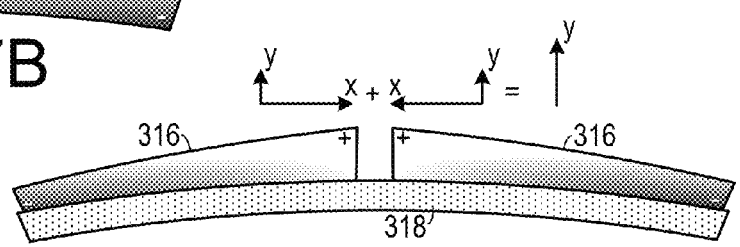

As shown in FIG. 7A, each of the elongated frustoconically-shaped piezoelectric nanostructures 316 has an even charge distribution while at rest. However, as shown in FIG. 7B, they have an uneven charge distribution when subjected to strain. Such distribution results in an electric field with both lateral (x-axis) components and a vertical (y-axis) component. As shown in FIG. 7C, the lateral components tend to cancel each other out due to the random lateral orientation of the frustoconically-shaped piezoelectric nanostructures 316, whereas the vertical components tend to be additive.

In one experimental embodiment, utilizing the conical shape of the ZnO nanowires, a simple, cost-effective and scalable nanogenerator was produced for producing high output power that was strong enough to continuously drive a commercial LCD. Unipolar-assembly of the frusto-conical nanowires 316 in such a composite structure may result in a macroscopic piezoelectric potential across its thickness by introducing a mechanical deformation, which results in the distribution and flow of inductive charges between the electrodes on the top and bottom surfaces of the structure.

The basic structure of one experimental embodiment of a nanogenerator included two metal films sandwiching a composite, which was made of a unipolar-assembly of frusto-conical nanowires infiltrated with PMMA. First, a Cr/Au (50 nm/50 nm) metal layer was deposited on a Kapton film (127 μm in thickness, Dupont 500HN) by electron beam evaporation. A layer of PMMA (about 2 μm in thickness) was spun coated onto the metal film. The deviation in flatness of the PMMA film was less than 1 nm as measured by atomic force microscopy imaging. The nanowires used in the experimental embodiment were grown on a solid substrate via vapor deposition process with lengths over 30 μm. The nanowires had a frusto-conical shape due to the fastest growth along the c-axis and a much slower growth rate in the basal plane. The conical shape of the nanowires is important for this embodiment.

The conical nanowires together with the substrate were soaked into ethanol. Application of an ultrasonic wave chopped off the nanowires from the substrate, forming a freely suspended nanowire suspension. By dispersing a droplet of the nanowire suspension onto the PMMA film, the nanowires were fairly uniformly distributed on the substrate surface with random lateral orientations. The area density of the nanowires on the substrate was about 1400~1500 nanowires per mm$^2$, which avoided overlapping and aggregations among the nanowires. The spin-coating of a thin PMMA layer (~100 nm) and dropping-on of the ZnO nanowire suspension were carried out repeatedly to form a rationally designed "composite" structure. When five cycles of PMMA and ZnO nanowires were deposited alternatively, another thicker PMMA layer (~2 μm) was deposited, on which a Cr/Au (50 nm/50 nm) metal film was deposited to serve as an electrode. The size of the whole device was about 1.5×2 cm$^2$, and it was robustly bent for many cycles.

For electricity generation, the as-fabricated nanogenerator was attached to a flexible polystyrene substrate (~1 mm in thickness) and an external force strained the assembled structure from the back of the substrate. Therefore, the nanogenerator experienced a compressive strain when mechanically agitated, thus the nanowires were under compressive strain.

The working principle of the assembled nanogenerator results from the unipolar-assembly of the frusto-conical nanowires. The nanowires laid down with random lateral orientation, while the bottom side surfaces were tightly attached to the flat surface of the substrate. With considering the [0001] growth direction of the ZnO nanowires, which represents the polar direction of a nanowire. The conical shape of the nanowires results in a constructive alignment in their projected polar directions for all of the nanowires in the direction perpendicular to the substrate and pointing downward into the substrate. Owing to the geometrical shape, the component of the c-axis of each nanowire in the normal direction of the substrate is $c \sin(\alpha/2)$, where $\alpha$ is the conical angle of the nanowire. This projected component of all of the nanowires along the vertical direction constructively adds up, which is the source of piezoelectric polarization across the thickness of the composite structure for creating the piezo-potential.

Using the conical shape of the ZnO nanowires, a nanogenerator is fabricated by simply dispersing them onto a flat PMMA film to form a rational "composite" structure. The flat PMMA surface may lead to a projected c-axis unipolar-assembly of the conical-nanowires in the direction perpendicular to the substrate, which produces a macroscopic piezoelectric potential across the thickness of the structure by mechanical deformation. It is suggested that the observed AC current the dynamic flow of inductive charges between the top and bottom surface electrodes of the structure once subjecting to dynamic mechanical straining. For a nanogenerator with a thickness projected nanowire density of 7000/mm$^2$ and physical size of 1.5×2 cm$^2$, compressive strain of 0.11% at a straining rate of 3.67% s$^{-1}$ produces an output voltage up to 2 V (equivalent open circuit voltage of 3.3V), which has been shown to continuously drive a commercial liquid crystal display (LCD). Importantly, the size of the nanogenerator used for driving the LCD had a size that was comparable to the size of the lighting area, so that it could be integrated at the back of the LCD, indicating its possibility for live-driving of a flexible display. This embodiment of a nanogenerator is a simple, cost-effective and scalable technology which may be used, for example, in small personal electronics and self-powered systems.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A method of making a generator, comprising:
   a. depositing a first electrode layer onto a substrate;
   b. depositing at least a first insulator layer onto the first electrode layer;
   c. placing at least a first plurality of elongated frustoconically-shaped piezoelectric nanostructures onto the first insulator layer so that the piezoelectric nanostructures are oriented so as to have different lateral axes and so as to have a substantially common vertical axis;
   d. depositing at least a second insulator layer onto the first plurality of elongated frustoconically-shaped piezoelectric nanostructures; and
   e. depositing a second electrode layer above the second insulator layer.

2. The method of claim 1, wherein the substrate comprises a polymer film.

3. The method of claim 2, wherein the polymer film comprises poly(4,4'-oxydiphenylene-pyromellitimide).

4. The method of claim 1, wherein the first electrode layer and the second electrode layer comprises a metal.

5. The method of claim 1, wherein the frustoconically-shaped piezoelectric nanostructures comprise zinc oxide.

6. The method of claim 1, wherein the first insulator layer and the second insulator layer comprise poly(methyl methacrylate).

7. The method of claim 1, further comprising the steps of:
   a. placing a second plurality of elongated frustoconically-shaped piezoelectric nanostructures onto the second insulator layer so that the piezoelectric nanostructures are oriented so as to have different lateral axes and so as to have a substantially common vertical axis; and
   b. depositing a third insulator layer onto the second plurality of elongated frustoconically-shaped piezoelectric nanostructures.

* * * * *